(12) United States Patent
Jang et al.

(10) Patent No.: US 8,031,122 B2
(45) Date of Patent: Oct. 4, 2011

(54) PROTECTIVE CIRCUIT MODULE AND SECONDARY BATTERY PACK INCLUDING THE SAME

(75) Inventors: Youngcheol Jang, Yongin-si (KR); Nohyun Kwag, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 424 days.

(21) Appl. No.: 12/246,763

(22) Filed: Oct. 7, 2008

(65) Prior Publication Data

US 2009/0109099 A1 Apr. 30, 2009

(30) Foreign Application Priority Data

Oct. 30, 2007 (KR) .................. 10-2007-0109726

(51) Int. Cl.
*H01Q 1/38* (2006.01)
*H01Q 11/12* (2006.01)

(52) U.S. Cl. ............... 343/700 MS; 343/741; 343/866

(58) Field of Classification Search .............. 343/702, 343/700 MS, 741, 866, 895
See application file for complete search history.

(56) References Cited

U.S. PATENT DOCUMENTS

| | | | |
|---|---|---|---|
| 6,492,058 B1 * | 12/2002 | Watanabe et al. | 429/121 |
| 6,628,931 B1 | 9/2003 | Tomida | |
| 7,439,933 B2 * | 10/2008 | Uesaka | 343/895 |
| 7,562,445 B2 * | 7/2009 | Lerch et al. | 29/832 |
| 7,679,315 B2 * | 3/2010 | Kim et al. | 320/106 |
| 7,736,800 B2 * | 6/2010 | Lee | 429/181 |
| 7,859,480 B2 * | 12/2010 | Shimizu | 343/895 |
| 2005/0142439 A1 * | 6/2005 | Lee et al. | 429/163 |
| 2006/0263647 A1 * | 11/2006 | Moon et al. | 429/7 |
| 2007/0011870 A1 | 1/2007 | Lerch et al. | |

FOREIGN PATENT DOCUMENTS

| | | |
|---|---|---|
| JP | 2000-174651 | 6/2000 |
| JP | 2001-228042 | 8/2001 |
| KR | 10-1997-0072551 A | 11/1997 |
| KR | 10-0343898 | 6/2002 |
| KR | 10-2004-0075202 A | 8/2004 |
| KR | 10-2006-0110579 | 10/2006 |
| KR | 10-2006-0132345 A | 12/2006 |
| KR | 10-0944989 | 2/2010 |

OTHER PUBLICATIONS

English abstract of Korean Publication 10-1997-0072551, published Nov. 7, 1997, previously filed in an IDS dated Jul. 29, 2010.
Machine translation of JP 2000-174651.
SIPO Office action dated Apr. 6, 2011, for corresponding Chinese Patent application 200810171166.4, with English translation, noting listed reference in this IDS.
English-language abstract of KR 10-2000-0023068.
English-language abstract of KR 10-2006-0068119.

* cited by examiner

*Primary Examiner* — Hoang V Nguyen
(74) *Attorney, Agent, or Firm* — Christie, Parker & Hale, LLP

(57) ABSTRACT

A protective circuit module including a layered insulating substrate, a printed circuit pattern disposed within the insulating substrate, and a loop antenna electrically connected to the printed circuit pattern. Ends of the loop antenna can be inserted into the insulating substrate and connected to the printed circuit pattern. Portions of the printed circuit pattern may extend out of the insulating substrate, and may be connected to the loop antenna. The protective circuit module can be included in a secondary battery pack comprising a secondary battery. The loop antenna can be adhered to the secondary battery.

20 Claims, 7 Drawing Sheets

PROTECTIVE CIRCUIT MODULE AND SECONDARY BATTERY PACK INCLUDING THE SAME

CROSS-REFERENCE TO RELATED APPLICATION

This application claims the benefit of Korean Application No. 2007-109726, filed Oct. 30, 2007, in the Korean Intellectual Property Office, the disclosure of which is incorporated herein, by reference.

BACKGROUND OF THE INVENTION

1. Field of the Invention

Aspects of the present invention relate to a protective circuit module and a secondary battery pack including the same.

2. Description of the Related Art

Compact and light-weight mobile electric/electronic devices, such as cellular phones, notebook computers, and camcorders are currently being actively developed and produced. Such mobile electric/electronic devices have a battery pack mounted therein for portable operation. The battery pack includes a secondary battery that is capable of being recharged. Typical secondary batteries include Ni—Cd batteries, Ni—MH batteries, Li batteries, and Li-ion batteries. A Li-ion secondary battery has an operation voltage that is three times higher than that of a Ni—Cd battery or a Ni—MH battery. Further, a Li-ion secondary battery has a higher energy density per unit weight.

A secondary battery is electrically connected to a protective circuit module that controls the charging/discharging of the secondary battery and cuts of current flow when the secondary battery is overheated or experiences an over-current. Further, such a protective circuit module can include a loop antenna that is soldered thereto, so that it can perform an RFID function.

At this time, a problem may occur when a secondary battery that is manufactured with an injection molding material in a pack shape is soldered to a loop antenna. In particular, the coupling between the protective circuit module and the loop antenna can be deficient, which can lead to an increase in contact resistance.

SUMMARY OF THE INVENTION

An aspect of the present invention is to provide a secondary battery pack having an improved coupling between a printed circuit pattern and a loop antenna.

According to aspects of the present invention, a protective circuit module includes: an insulating substrate; a printed circuit pattern formed on/in the substrate; and a loop antenna connected electrically to the printed circuit pattern.

According to aspects of the present invention, provided is a protective circuit module including: a printed circuit pattern; a charging/discharging terminal mounted on the insulating substrate and electrically connected to the printed circuit pattern; a protection circuit part mounted on the insulating substrate and electrically connected to the printed circuit pattern; and a loop antenna electrically connected to the printed circuit pattern.

According to aspects of the present invention, provided is a secondary battery pack, comprising: the protective circuit module; a secondary battery electrically connected to a charging/discharging path of the protective circuit module; and a coupling member to couple the loop antenna to the secondary battery.

According to aspects of the present invention, the secondary battery may be a can-type or a pouch-type secondary battery. The secondary battery may be coupled with the loop antenna, using an adhesive or a coupling member.

According to aspects of the present invention, the loop antenna may be coupled to the printed circuit pattern, by inserting the loop antenna among a plurality of layers formed on the insulating substrate.

According to aspects of the present invention, the loop antenna may be coupled to a portion of the printed circuit pattern that protrudes from the insulating substrate.

According to aspects of the present invention, the loop antenna may be an RFID antenna. The loop antenna may include a conductive copper film, or a conductive wire, that is electrically connected to the printed circuit pattern. The wire or film may be coated with an insulator. The insulator may be an insulating film.

According to aspects of the present invention, the loop antenna may be formed as a continuous loop, which can have various shapes.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EMBODIMENTS

Figure 1A:
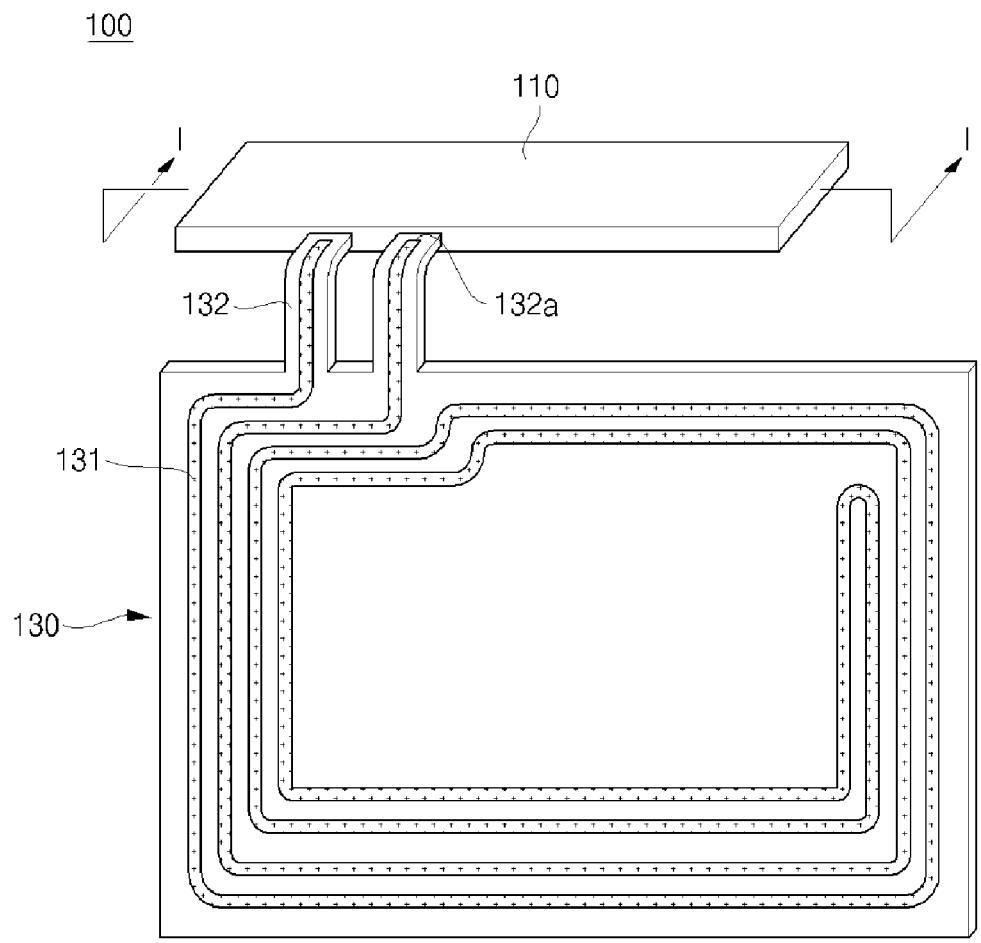
FIG. 1A is a perspective view of a protective circuit module, in accordance with one exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Figure 1B:
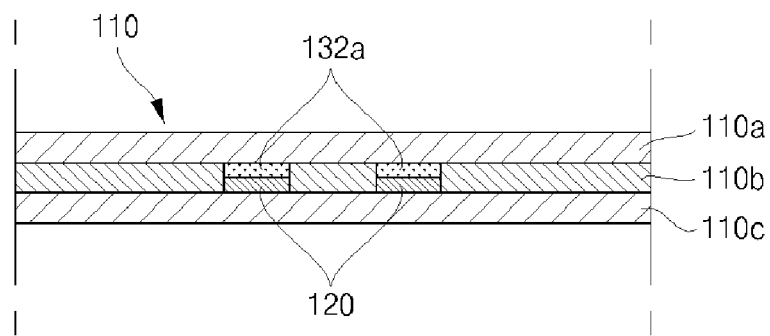
FIG. 1B is a cross-sectional view taken along line I-I of FIG. 1A.

FIG. 1A is a perspective view of a protective circuit module 100, in accordance with an exemplary embodiment of the present invention. FIG. 1B is a cross-sectional view taken along line I-I of FIG. 1A. Referring to FIGS. 1A and 1B, the protective circuit module 100 includes an insulating substrate 110 and a loop antenna 130.

The insulating substrate 110 includes a plurality of layers. As shown in FIG. 1B, the insulating substrate 110 can include an upper layer 110a, an intermediate layer 110b, and a lower layer 110c. The insulating substrate 110 may be formed of an epoxy or Bakelite resin, but is not limited thereto.

A printed circuit pattern 120 can be formed in the intermediate layer 110b, or among any of the layers of the insulating substrate 110. The printed circuit pattern 120 can be formed of a conductive material, such as a copper film, or the like. The printed circuit pattern 120 can also extend to the upper or lower surface of the insulating substrate 110, in order to facilitate a connection to an electrical device. The printed circuit pattern 120 is mounted in the insulating substrate 110, when the insulating substrate 110 is formed, and is bonded to the insulating substrate 110 with a strong coupling force, for example, by heating and pressing upper/lower portions of the insulating substrate 110.

The loop antenna 130 is electrically connected to the printed circuit pattern 120. The loop antenna 130 can be formed of a conductive wire, or a conductive copper film 131, but is shown as a conductive film in FIG. 1A. The loop antenna 130 is inserted into the substrate 110, and electrically connected to the printed circuit pattern 120.

Referring to FIG. 1B, ends 132a of the loop antenna 130 are inserted between the layers 110a, 110b, and 110c of the insulating substrate 110. The ends 132a are then electrically connected to the printed circuit pattern 120. In particular, the ends 132a are positioned on the lower layer 110c, before the intermediate layer 110b and upper layer 110 are stacked thereon and compressed. That is, the ends 132a of the loop antenna can be integrated with the printed circuit pattern 120, when the layers 110a, 110b, and 110c are pressed together.

The coupling of the loop antenna 130 and the printed circuit pattern 120 can be strengthened, by disposing the coupling between the layers 110a, 110b, and 110c of the insulating substrate 110. Further, since the ends 132a of the loop antenna 130 are disposed within the insulating substrate 110, interference, due to current flowing on the upper/lower surfaces of the insulating substrate 110, can be reduced. Further, because a soldering process is not used to couple the loop antenna 130 to a surface of the insulating substrate 110, the processing time thereof, can be reduced.

The loop antenna 130 may be an RFID antenna. The loop antenna 130 can be used to transmit an RFID signal to an external device. The RFID signal may include information relating to the type, shape, and production date of a mobile electronic device or a secondary battery. By changing the impedance of the loop antenna, the magnetic force of the loop antenna 130 is changed. Therefore, it is possible to detect the information, by measuring the changed magnetic force of the loop antenna 130. However, the present invention is not limited to the RFID aspects of the loop antenna 130.

The loop antenna 130 can be formed of a conductive wire (not shown) or conductive copper film 131. The path of the loop antenna 130 can be arranged in various shapes, so as to receive an RFID signal. The loop antenna 130 may have a circular shape, to increase the sensitivity and reduce the size of the loop antenna 130.

The loop antenna 130 can be coated with an insulator 132. The insulator 132 can be formed of a polyethylene or polypropylene resin, however, the present invention is not limited thereto. The insulator 132 may be an insulating film formed around the conductive wire or conductive copper film 131. The insulating film allows the loop antenna 130 to be easily attached to the surface of an electronic device or battery pack.

Figure 2A:
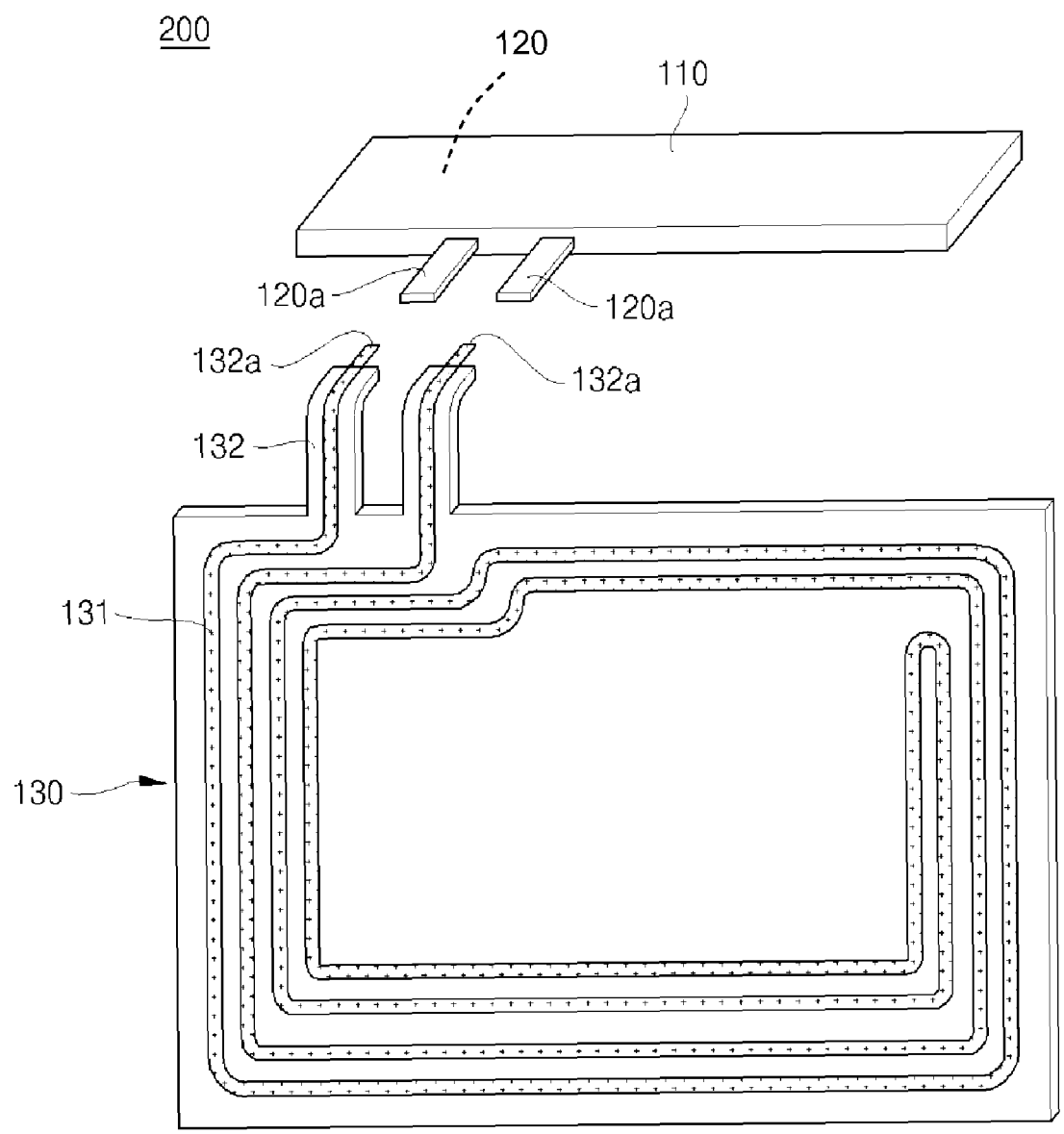
FIG. 2A is an exploded perspective view of a protective circuit module, in accordance with another exemplary embodiment of the present invention.
Figure 2B:
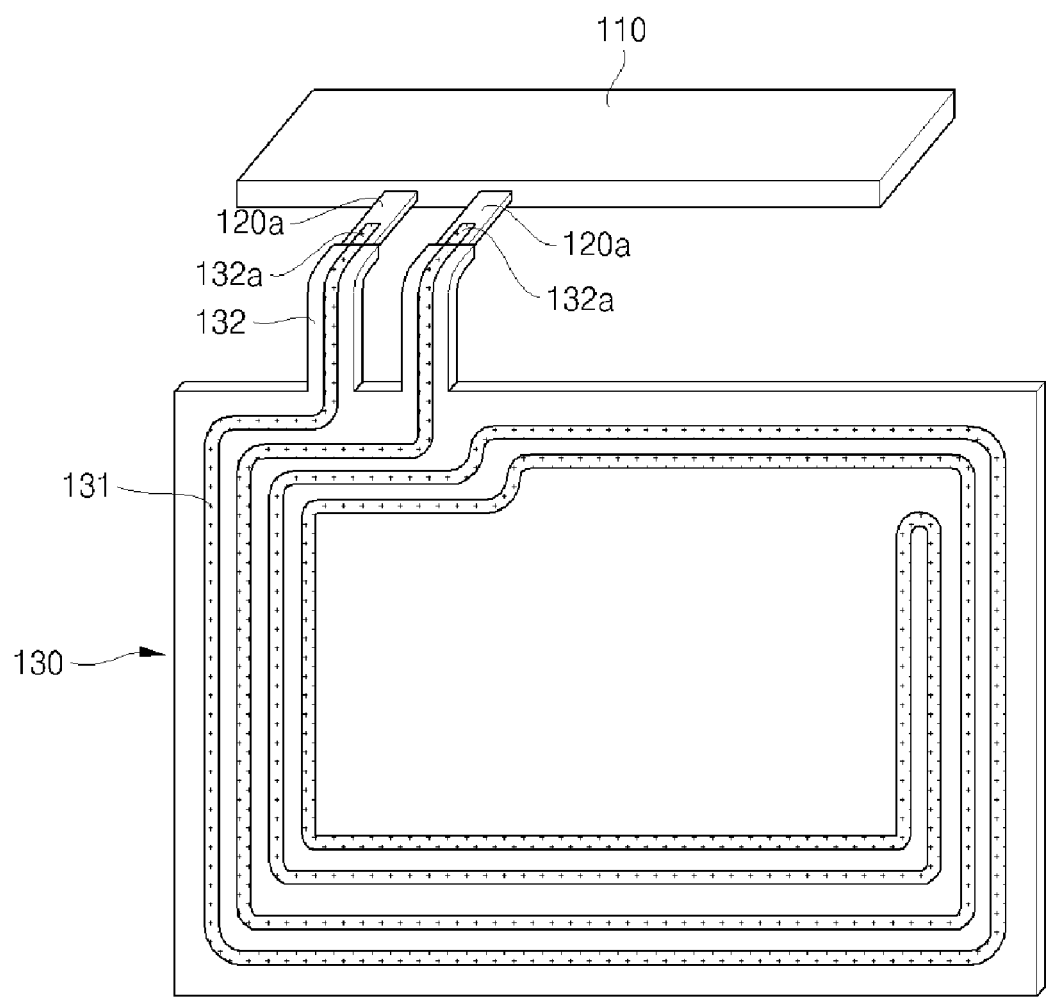
FIG. 2B is a perspective view illustrating the protective circuit module of FIG. 2A, as assembled.

FIG. 2A is an exploded perspective view of a protective circuit module 200, in accordance with another exemplary embodiment of the present invention. FIG. 2B is a perspective view of the protective circuit module 200 of FIG. 2A, as assembled.

Referring to FIGS. 2A and 2B, the protective circuit module 200 includes an insulating substrate 110, a printed circuit pattern 120a, and a loop antenna 130. A detailed description of the insulating substrate 110, the printed circuit pattern 120, and the loop antenna 130 is omitted, since these elements are similar to those described above.

Portions 120a of the printed circuit pattern 120 extend out of the insulating substrate 110. Ends 132a of the loop antenna 130 are electrically connected to the portions 120a. The ends 132a can be coupled to the portions 120a, by soldering, resistance welding, or ultrasonic welding, for example. The portions 120a generally extend far enough, so as to overlap the ends 132a, which can facilitate coupling. The portions 120a can be thicker than other parts of the printed circuit pattern 120. Therefore, the loop antenna 130 can be strongly coupled with the printed circuit pattern 120.

Figure 3A:
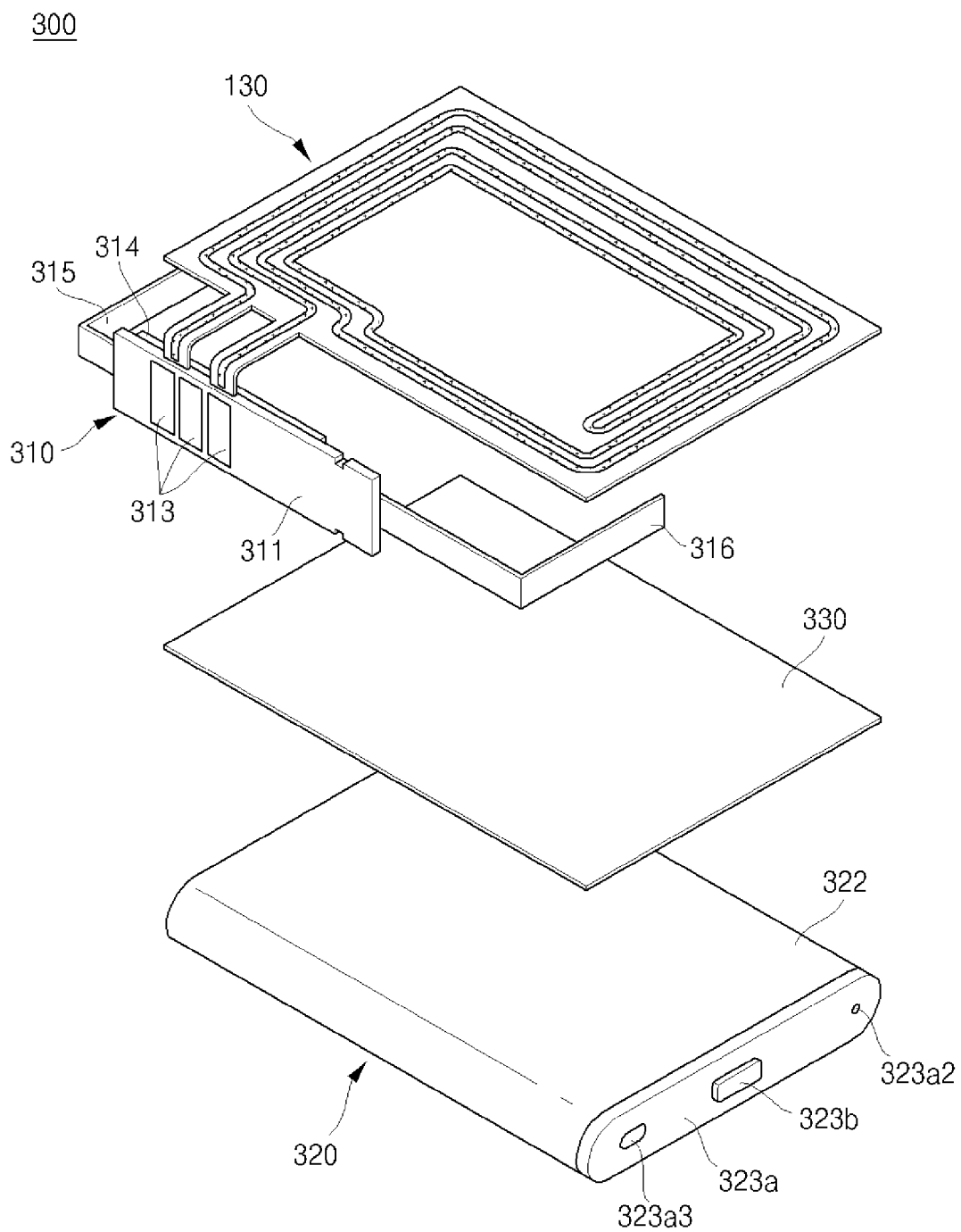
FIG. 3A is an exploded perspective view of a secondary battery pack, in accordance with still another exemplary embodiment of the present invention.
Figure 3B:
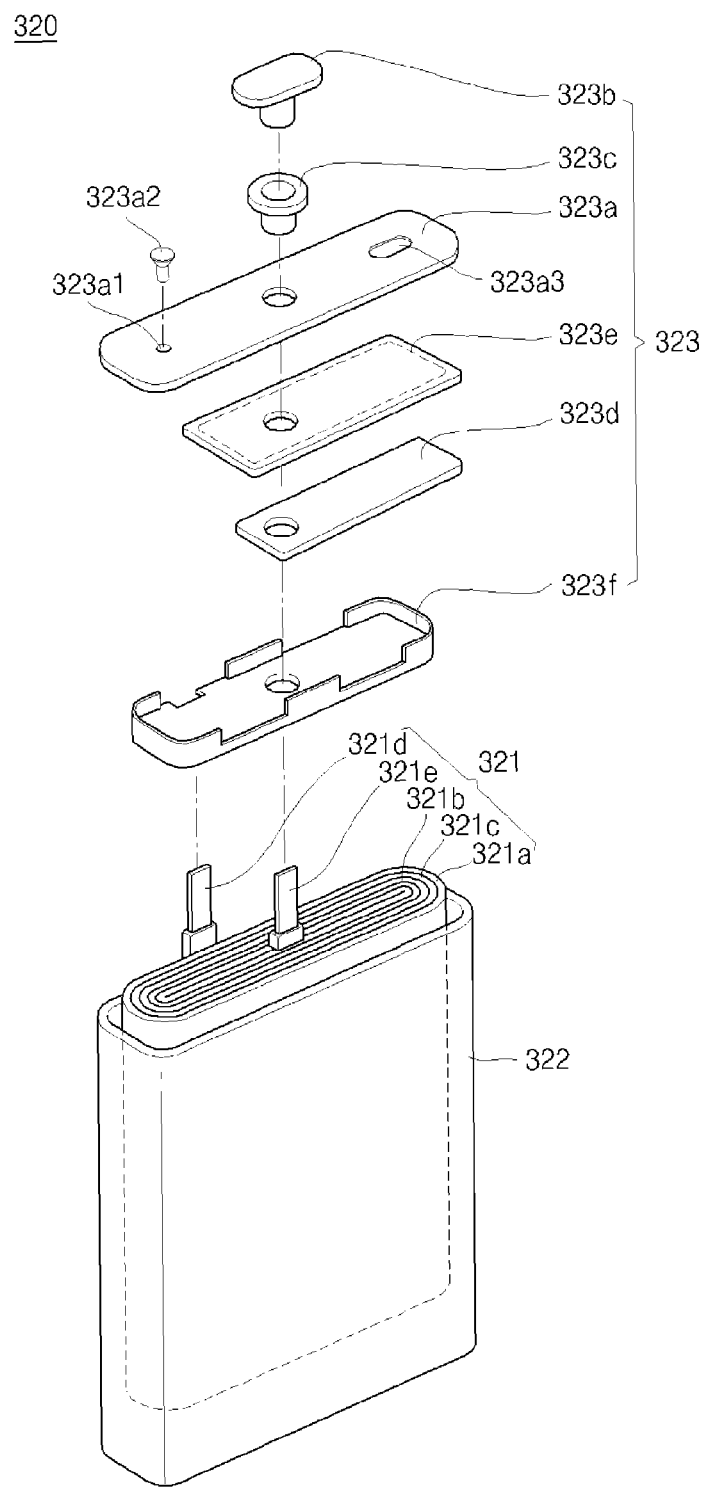
FIG. 3B is an exploded perspective view of a secondary battery of FIG. 3A.

FIG. 3A is an exploded perspective view of a secondary battery pack 300, in accordance with an exemplary embodiment of the present invention. FIG. 3B is an exploded perspective view of a secondary battery 320 of FIG. 3A. The secondary battery 320 is a can-type secondary battery; however, the present invention is not limited thereto. Referring to FIGS. 3A-3B, the secondary battery pack 300 includes a protective circuit module 310, the secondary battery 320, and a coupling member 330.

The protective circuit module 310 includes an insulating substrate 311, a printed circuit pattern (not shown), a charging/discharging terminal 313, a protection circuit part 314, and a loop antenna 130. The insulating substrate 311 can include a plurality of layers, as described with reference to FIG. 1B, and can be formed of an epoxy or Bakelite resin. However, the present invention is not limited thereto.

The charging/discharging terminal 313 can be formed on the upper surface of the insulating substrate 311 and can be electrically connected to the printed circuit pattern. The charging/discharging terminal 313 can include 3 separate terminals, as shown in FIG. 3A. Two of the terminals can be connected to positive and negative electrodes of the secondary battery 320, and one of the terminals can be used to detect information about the battery, such as a battery temperature, or a charge amount. As such, the charging/discharging terminal 313 can be used to electrically connect the secondary battery 320 to a charger (not shown) or a mobile electronic device (not shown).

The protection circuit part 314 can include a passive element (not shown), an active element (not shown), and/or a protection circuit (not shown), and can be electrically soldered to the printed circuit pattern. The passive element may be a resistor or a condenser, and can be electrically coupled with the printed circuit pattern, using a coupling method such as soldering. The passive element can filter signals, buffer voltage and current, and/or provide resistance information to the charger or external device.

The active element can be a field effect transistor (MOSFET), or a transistor that serves as a switch for an electrical connection to the external device. The active element can include a parasitic diode, and a voltage, current, or temperature sensing element. A power supply element may be used to supply power to the protection circuit. These elements may be in the form of an integrated circuit. A thermal fuse, a thermal breaker, and/or a PTC safety element may be included in the protection circuit part 314.

The protection circuit part 312 manages the charging/discharging of the secondary battery 320, by detecting the charge of the secondary battery, or selecting a suitable charging scheme. The protection circuit part 312 stores information on voltage, current, temperature, and/or charge of the secondary battery 320, and transmits this information to an the external device.

The secondary battery 320 can be coupled with the loop antenna 130, by the coupling member 330. Further, a positive electrode and a negative electrode of the secondary battery 320 are electrically connected to the protective circuit module 310, by a positive connector tab 315 and a negative connector tab 316. The secondary battery 320 may be a lithium ion battery, or a lithium polymer battery, for example.

As shown in FIG. 3B, the secondary battery 320 includes an electrode assembly 321 that is inserted into a can 322. The electrode assembly 321 can be formed by stacking and spirally winding a positive electrode plate 321$a$, a negative electrode plate 321$b$, and a separator 321$c$ disposed therebetween. The positive electrode plate 321$a$ is connected to a positive electrode tab 321$d$. The negative electrode plate 321$b$ is connected to a negative electrode tab 321$e$. An opening of the can 322 is sealed with a cap assembly 323.

Referring to FIG. 3B, the positive electrode plate 321$a$ includes a positive current collector that is coated with a positive active material. The positive active material can include lithium, a binder to enhance coherence, and a conductive material to enhance conductivity. The positive current collector is generally formed of aluminum foil. The positive electrode tab 321$d$ is attached to an uncoated portion of the positive current collector.

The negative electrode plate 321$b$ includes a negative current collector that is coated with a negative active material. The negative active material can include a hard carbon such as graphite, and a binder to enhance the coherence of the negative active material. The negative current collector may be formed of copper foil. The negative electrode tab 321$e$ is attached to an uncoated portion of the negative current collector.

The separator 321$c$ insulates the positive electrode plate 321$a$ from the negative electrode plate 321$b$ and is permeable to ions. Generally, the separator 321$c$ may be formed of polyethylene (PE) or polypropylene (PP), but the present invention is not limited thereto. The separator 321$c$ may include a polymer electrolyte.

The can 322 may be rectangular or cylindrical, in consideration of the shape of the electrode assembly 321. The can 322 houses the electrode assembly 321 and is sealed by the cap assembly 323. Generally, the can 322 may be formed of aluminium, but the present invention is not limited thereto.

The cap assembly 323 may include a cap plate 323$a$, an electrode terminal 323$b$, an insulating gasket 323$c$, a terminal plate 323$d$, an insulating plate 323$e$, and an insulation case 323$f$. The cap plate 323$a$ includes a safety vent 323$a$3 and seals an opening of the can 322. The cap plate includes an electrolyte injection hole 323$a$1, through which an electrolyte is injected into the can 322. The electrolyte injection hole 323$a$1 is sealed by an electrolyte injection hole cap 323$a$2. The negative electrode tab 321$d$ is electrically connected to the cap plate 323$a$.

The electrode terminal 323$b$ is mounted on a center hole of the cap plate 323$a$ and is connected electrically to the negative electrode tab 321$e$. The insulating gasket 323$c$ insulates the electrode terminal 321$e$ from the cap plate 323$a$.

The terminal plate 323$d$ includes a hole that helps to secure the electrode terminal 323$b$. The terminal plate 323$d$ may be electrically connected to the negative electrode tab 321$e$. The insulating plate 323$e$ insulates the terminal plate 323$d$ from the cap plate 323$a$. The insulation case 323$f$ includes a groove and a hole, through which the positive electrode tab 321$d$ and the negative electrode tab 321$e$ project. The insulation case 323$f$ is securely mounted on the electrode assembly 321, so as to insulate the upper surface of the electrode assembly 321.

The insulation gasket 323$c$, the insulation case 323$f$, and the insulation plate 323$e$ can be formed of an insulating material, such as a polypropylene resin or a polyethylene resin. The electrode terminal 323$b$, cap plate 323$a$, and terminal plate 323$d$ can be formed of a conductive material, such as aluminum, an aluminum alloy, nickel, or a nickel alloy. However, the present invention is not limited to the above materials.

The coupling member 330 couples the secondary battery 320 to the loop antenna 130. The coupling member 330 can be formed of a double coated tape. The coupling member 330 may be an adhesive that is applied between the secondary battery 320 and the loop antenna 130.

The coupling of the loop antenna 130 and the protective circuit module 310 is enhanced, since the loop antenna 130 and the secondary battery 320 are coupled using the coupling member 330. In addition, the loop antenna 130 can be inserted into the protective circuit module 310. Accordingly, when the loop antenna 130 is attached to the secondary battery 320, an injection molding operation can be performed to further secure the loop antenna 130 to the secondary battery 320.

Figure 4A:
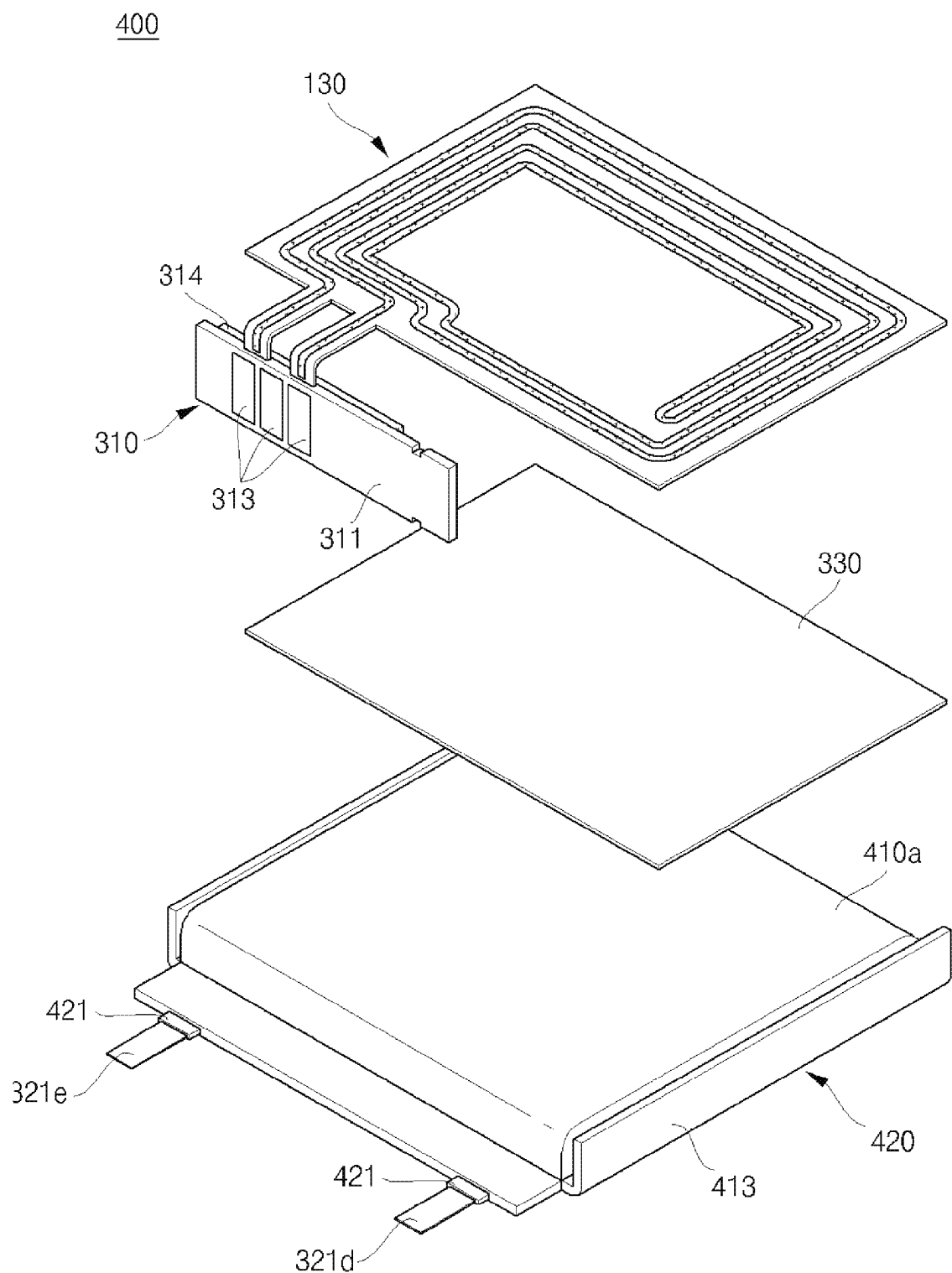
FIG. 4A is an exploded perspective view of a secondary battery pack, in accordance with still another exemplary embodiment of the present invention.
Figure 4B:
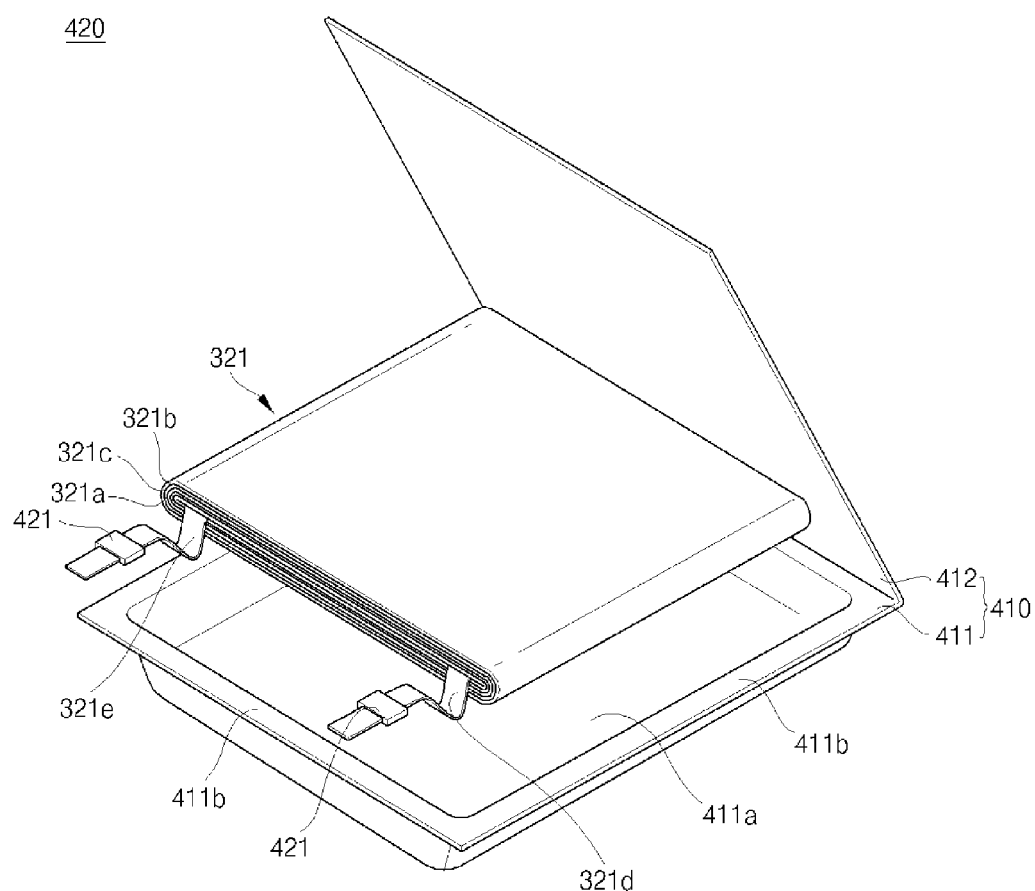
FIG. 4B is an exploded perspective view of the secondary battery pack of FIG. 4A.

FIG. 4A is a perspective view of a secondary battery pack 400, in accordance with still another exemplary embodiment of the present invention. FIG. 4B is a perspective view of a secondary battery 420 of FIG. 4A. As shown in FIG. 4A, the secondary battery pack 400 is similar to the battery pack 300, except that the secondary battery 420 is a pouch-type secondary battery, rather than a can-type secondary battery. In particular, the secondary battery 420 includes a pouch 410, an electrode assembly 321 that is inserted into the pouch 410, a protective circuit module 310, and a loop antenna 130.

The electrode assembly 321 includes a positive electrode tab 321$d$ and a negative electrode tab 321$e$, which extend through the pouch 410. The pouch 410 may include multiple layers, such as an inner layer formed of cast polypropylene (CPP), an intermediate layer formed of aluminum, and an outer layer formed of nylon. The pouch 410 can include a lower portion 411 having a receiving groove 411$a$ to receive the electrode assembly 321, and an upper portion 412 that is thermally adhered to the lower film 411. Insulating tapes 421 are used to insulate the positive and negative electrode tabs 321$d$ and 321$e$, from the intermediate layer of the pouch 410. A contact portion 411$b$ is formed where the upper and lower portions 412 and 411 are sealed together. Then, the contact portion 411$b$ is folded, to form a folded portion 413, as shown in FIG. 4A.

The secondary battery pack 400 includes a coupling member 330 that couples the secondary battery 420 to the loop antenna 130. The coupling member 330 can be a double coated adhesive tape or an adhesive layer. The protective circuit module 310 includes an insulating substrate 311, a printed circuit pattern (not shown), a charging/discharging terminal 313, and a protection circuit part 314. The loop antenna 130 can be inserted into the protection circuit substrate 310, and can be attached to a surface 400$a$ of the pouch 400. The negative electrode tab 321$d$ and the positive electrode tab 321$e$ are electrically connected to the protective circuit module 310.

In the secondary battery pack 400, the loop antenna 130 is attached to the surface 410a of the pouch 420, so that its coupling force is increased. Also, when the secondary battery pack 400 is formed by injection molding, its structure is more flexible than that of a can-type secondary battery. Accordingly, it is possible to form a battery pack having RFID functionalities, and a changeable mounting type.

In a protective circuit module of the present invention, a loop antenna is connected to a printed circuit pattern that is disposed among layers of an insulating substrate. This structure increases the coupling force between the insulating substrate and the loop antenna, thereby reducing contact errors and preventing an increase in contact resistance.

Although a few exemplary embodiments of the present invention have been shown and described, it would be appreciated by those skilled in the art that changes may be made in these embodiments, without departing from the principles and spirit of the invention, the scope of which is defined in the claims and their equivalents.

What is claimed is:

1. A protective circuit module, comprising:
   an insulating substrate comprising an inner layer, an outer layer, and an intermediate layer disposed between the inner layer and the outer layer;
   a printed circuit pattern embedded in the intermediate layer between the inner layer and the outer layer; and
   a loop antenna electrically connected to the printed circuit pattern, ends of the loop antenna being embedded in the intermediate layer between the inner layer and the outer layer and connected to the printed circuit pattern.

2. The protective circuit module as claimed in claim 1, wherein the ends of the loop antenna are inserted into the insulating substrate and connected to the printed circuit pattern.

3. The protective circuit module as claimed in claim 1, wherein a portion of the printed circuit pattern protrudes from the insulating substrate and is coupled to the loop antenna.

4. The protective circuit module as claimed in claim 1, wherein the loop antenna is a radio frequency identification (RFID) antenna.

5. The protective circuit module as claimed in claim 1, wherein the loop antenna comprises a conductive wire or a conductive copper film, which is electrically connected to the printed circuit pattern.

6. The protective circuit module as claimed in claim 5, wherein the loop antenna comprises an insulating coating.

7. The protective circuit module as claimed in claim 5, wherein the insulating coating is an insulating film.

8. The protective circuit module as claimed in claim 5, wherein the loop antenna is in the faun of a conductive loop.

9. A secondary battery pack, comprising:
   a protective circuit module comprising:
      an insulating substrate comprising an inner layer, an outer layer, and an intermediate layer disposed between the inner layer and the outer layer,
      a printed circuit pattern embedded in the intermediate layer between the inner layer and the outer layer,
      a charging/discharging terminal mounted on the insulating substrate and electrically connected to the printed circuit pattern,
      a protection circuit part mounted on the insulating substrate and electrically connected to the printed circuit pattern, and
      a loop antenna electrically connected to the printed circuit pattern, ends of the loop antenna being embedded in the intermediate layer between the inner layer and the outer layer and connected to the printed circuit pattern;
   a secondary battery electrically connected to the protective circuit module; and
   a coupling member to couple the loop antenna to the secondary battery.

10. The secondary battery pack as claimed in claim 9, wherein the ends of the loop antenna are disposed within the insulating substrate and are coupled to the printed circuit pattern.

11. The secondary battery pack as claimed in claim 9, wherein a portion of the printed circuit pattern extends out of the insulating substrate and is coupled to the loop antenna.

12. The secondary battery pack as claimed in claim 9, wherein the battery is a can-type secondary battery.

13. The secondary battery pack as claimed in claim 9, wherein the battery is a pouch-type secondary battery.

14. The secondary battery pack as claimed in claim 9, wherein the coupling member is an adhesive coating.

15. The secondary battery pack as claimed in claim 9, wherein the loop antenna is a radio frequency identification (RFID) antenna.

16. The secondary battery pack as claimed in claim 9, wherein the loop antenna comprises a conductive wire or a conductive copper film.

17. The secondary battery pack as claimed in claim 16, wherein the loop antenna further comprises an insulating coating.

18. The secondary battery pack as claimed in claim 17, wherein the insulating coating is an insulating film.

19. The secondary battery pack as claimed in claim 16, wherein the loop antenna is in the form of a conductive loop.

20. A secondary battery pack, comprising:
   a protective circuit module comprising:
      an insulating substrate comprising a plurality of layers,
      a printed circuit pattern disposed within the layers of the insulating substrate,
      a charging/discharging terminal mounted on the insulating substrate and electrically connected to the printed circuit pattern,
      a protection circuit part mounted on the insulating substrate and electrically connected to the printed circuit pattern, and
      a loop antenna electrically connected to the printed circuit pattern;
   a secondary battery electrically connected to the protective circuit module; and
   a coupling member to couple the loop antenna to the secondary battery,
   wherein:
      the loop antenna comprises a conductive wire or a conductive copper film;
      the insulating substrate comprises an inner layer, an outer layer, and an intermediate layer disposed between the inner layer and the outer layer;
      the printed circuit pattern is disposed within the intermediate layer; and
      ends of the loop antenna are inserted into the intermediate layer and connected to the printed circuit pattern.

* * * * *

UNITED STATES PATENT AND TRADEMARK OFFICE
CERTIFICATE OF CORRECTION

| | | |
|---|---|---|
| PATENT NO. | : 8,031,122 B2 | Page 1 of 1 |
| APPLICATION NO. | : 12/246763 | |
| DATED | : October 4, 2011 | |
| INVENTOR(S) | : Youngcheol Jang et al. | |

It is certified that error appears in the above-identified patent and that said Letters Patent is hereby corrected as shown below:

In the Claims

Column 7, Claim 8, line 51.    Delete "faun"

Insert -- form --

Signed and Sealed this
Twenty-eighth Day of August, 2012

David J. Kappos
*Director of the United States Patent and Trademark Office*